US012660701B2

(12) United States Patent
Kim et al.

(10) Patent No.: US 12,660,701 B2
(45) Date of Patent: Jun. 16, 2026

(54) DISPLAY MODULE AND DISPLAY APPARATUS HAVING THE SAME

(71) Applicant: SAMSUNG ELECTRONICS CO., LTD., Suwon-si (KR)

(72) Inventors: Jaeseok Kim, Suwon-si (KR); Eunhye Kim, Suwon-si (KR); Sangmoo Park, Suwon-si (KR); Yoonsuk Lee, Suwon-si (KR); Seungryong Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 431 days.

(21) Appl. No.: 18/208,034

(22) Filed: Jun. 9, 2023

(65) Prior Publication Data

US 2023/0387095 A1      Nov. 30, 2023

Related U.S. Application Data

(63) Continuation of application No. PCT/KR2023/005034, filed on Apr. 13, 2023.

(30) Foreign Application Priority Data

May 31, 2022      (KR) ........................ 10-2022-0067224
Aug. 29, 2022      (KR) ........................ 10-2022-0108755

(51) Int. Cl.
*H10W 90/00*        (2026.01)
*H10W 72/30*        (2026.01)
(52) U.S. Cl.
CPC .......... *H10W 90/00* (2026.01); *H10W 72/342* (2026.01); *H10W 72/344* (2026.01);
(Continued)

(58) Field of Classification Search
CPC ....... H01L 24/32; H01L 25/167; H01L 24/29; H01L 25/0753; H01L 24/05; H01L 25/18;
(Continued)

(56) References Cited

U.S. PATENT DOCUMENTS 9,865,572 B2      1/2018  Wi et al.
10,797,213 B2    10/2020  Hsieh et al.
(Continued)

FOREIGN PATENT DOCUMENTS

CN        219144213 U      6/2023
JP        2009-10061 A      1/2009
(Continued)

OTHER PUBLICATIONS

International Search Report (PCT/ISA/210) issued by the International Searching Authority on Aug. 11, 2023 in corresponding International Application No. PCT/KR2023/005034.
(Continued)

*Primary Examiner* — Mouloucoulaye Inoussa
(74) *Attorney, Agent, or Firm* — Sughrue Mion, PLLC

(57)                ABSTRACT

In some embodiments, a display module for implementing an image using an inorganic light emitting device includes a substrate, a thin film transistor (TFT) layer provided on the substrate, a plurality of connection pads provided on the TFT layer, an anisotropic conductive layer provided on the TFT layer, an inorganic light emitting element bonded to the anisotropic conductive layer, and a conductive ball control layer provided in a surrounding area of the plurality of connection pads. The anisotropic conductive layer includes an adhesive layer and a plurality of conductive balls distributed inside the adhesive layer. The inorganic light emitting element includes a plurality of electrodes corresponding to the plurality of connection pads. The conductive ball control layer is configured to restrict the plurality of con-
(Continued)

420 ductive balls from moving in a direction perpendicular to a bonding direction while the inorganic light emitting element is being bonded to the anisotropic conductive layer.

19 Claims, 16 Drawing Sheets

(52) U.S. Cl.
CPC ........ *H10W 72/352* (2026.01); *H10W 72/354* (2026.01); *H10W 90/732* (2026.01)

(58) Field of Classification Search
CPC ....... H01L 24/13; H01L 25/105; H01L 24/83; H01L 2224/29144; H01L 2224/29164; H01L 2224/29028; H01L 2224/29021; H01L 2224/32147; H01L 2224/29155; H01L 2224/2919; H01L 2924/12041; H01L 2224/05567; H01L 2224/04026; H01L 2224/29011; H01L 2924/1426; H01L 2224/29083; H01L 2224/29364; H10H 20/857; H10H 20/852; H10H 29/852; H10H 29/857; H10D 86/443; H10D 86/60; H10D 86/441; G09G 3/3233; G09G 3/035; G09G 3/3225; G09G 2380/02; G09G 2300/0426; G09G 2300/0842; G06F 3/0412; G06F 3/044; G06F 3/0416; G06F 2203/04102; H10K 59/131; H10K 50/805; H10K 59/122; H10K 59/124
See application file for complete search history.

(56) References Cited

U.S. PATENT DOCUMENTS

| 11,842,016 | B2 * | 12/2023 | Sung | G09G 3/3233 |
|---|---|---|---|---|
| 2005/0069274 | A1 * | 3/2005 | Aoki | G02B 6/30 |
| | | | | 385/129 |
| 2006/0038298 | A1 * | 2/2006 | Park | H05K 3/361 |
| | | | | 257/772 |
| 2009/0185393 | A1 * | 7/2009 | Kang | G02B 6/0073 |
| | | | | 362/382 |

| 2010/0096175 | A1 * | 4/2010 | Ishimatsu | H01L 24/83 |
|---|---|---|---|---|
| | | | | 428/343 |
| 2011/0079501 | A1 * | 4/2011 | Arai | G06F 3/0412 |
| | | | | 361/679.01 |
| 2013/0026476 | A1 * | 1/2013 | Park | H10K 59/131 |
| | | | | 257/40 |
| 2013/0120329 | A1 * | 5/2013 | Wang | G02F 1/13452 |
| | | | | 345/206 |
| 2017/0062379 | A1 * | 3/2017 | Zhang | H01L 24/16 |
| 2017/0135209 | A1 * | 5/2017 | Kim | H05K 3/323 |
| 2018/0019234 | A1 * | 1/2018 | Hu | H01L 24/17 |
| 2018/0053808 | A1 * | 2/2018 | Chu | H10H 20/84 |
| 2018/0076182 | A1 * | 3/2018 | Wu | H01L 25/0753 |
| 2019/0148320 | A1 * | 5/2019 | Chu | H10D 86/443 |
| | | | | 257/88 |
| 2019/0326326 | A1 * | 10/2019 | Seo | H10D 86/441 |
| 2020/0013659 | A1 * | 1/2020 | Hori | H01L 21/683 |
| 2021/0157426 | A1 * | 5/2021 | Sung | G06F 3/0416 |
| 2022/0158057 | A1 * | 5/2022 | Song | H10H 20/01 |
| 2022/0310887 | A1 * | 9/2022 | Peng | H10H 20/852 |
| 2022/0384686 | A1 | 12/2022 | Kang et al. | |
| 2023/0178686 | A1 | 6/2023 | Choi et al. | |

FOREIGN PATENT DOCUMENTS

| KR | 10-2007-0034676 | A | 3/2007 |
|---|---|---|---|
| KR | 10-0922658 | B1 | 10/2009 |
| KR | 10-2016-0128536 | A | 11/2016 |
| KR | 10-2017-0061528 | A | 6/2017 |
| KR | 10-2017-0070664 | A | 6/2017 |
| KR | 10-2019-0018296 | A | 2/2019 |
| KR | 10-2020-0002733 | A | 1/2020 |
| KR | 10-2020-0031978 | A | 3/2020 |
| KR | 10-2258524 | B1 | 5/2021 |
| KR | 10-2021-0081019 | A | 7/2021 |
| KR | 10-2022-0067487 | A | 5/2022 |
| WO | 2021/230402 | A1 | 11/2021 |

OTHER PUBLICATIONS

Written Opinion (PCT/ISA/237) issued by the International Searching Authority on Aug. 11, 2023 in corresponding International Application No. PCT/KR2023/005034.

* cited by examiner

DISPLAY MODULE AND DISPLAY APPARATUS HAVING THE SAME

CROSS-REFERENCE TO RELATED APPLICATIONS

This application is a continuation application of International Application No. PCT/KR2023/005034, filed on Apr. 13, 2023, which claims priority to Korean Patent Application No. 10-2022-0067224, filed on May 31, 2022, and to Korean Patent Application No. 10-2022-0108755, filed on Aug. 29, 2022, in the Korean Intellectual Property Office, the disclosures of which are incorporated by reference herein in their entireties.

BACKGROUND

1. Field

The present disclosure relates generally to display modules, and more particularly, to a display module for implementing an image using an inorganic light emitting device and a display apparatus including the same.

2. Description of Related Art

A related display apparatus may be classified into a self-emissive display in which each pixel may emit light by itself and/or a non-emissive display that may need a separate light source.

A liquid crystal display (LCD) may be an example of a related non-emissive display that may need a backlight unit that supplies light from behind a display panel, a liquid crystal layer that may serve as a switch to transmit/block light, a color filter that may change supplied light to a desired color, and the like. Thus, the LCD may have a complex structure and, as a result, may be constrained with respect to achieving a small thickness.

Alternatively or additionally, a related self-emissive display may include a light-emitting element for each pixel. Thus, components, such as, but not limited to, a backlight unit, a liquid crystal layer, and a color filter, may not be not required and/or may be omitted. As a result, the related self-emissive display may be structurally comparatively simple and, as a result, may have a higher degree of freedom in design, when compared to a related non-emissive display (e.g., LCD). Alternatively or additionally, the related self-emissive display may achieve, in addition to a small thickness, a higher contrast ratio, a higher brightness level, and/or a wider viewing angle, when compared to a related non-emissive display (e.g., LCD).

Among the related self-emissive displays, a micro light-emitting diode (e.g., a micro LED) display may be an example of a flat panel display and may include a plurality of LEDs each having a relatively small size (e.g., approximately 100 micrometers ($\mu$m)). For example, in comparison with a related LCD that may require a backlight, the micro-LED display may provide better contrast, shorter response time, and/or higher energy efficiency.

SUMMARY

Accordingly, various aspects of the present disclosure provide a display module in which an inorganic light emitting element is mounted on a substrate through an anisotropic conductive layer, and a display apparatus having the same.

Alternatively or additionally, various aspects of the present disclosure provide a display module in which a plurality of conductive balls are trapped between electrodes of an inorganic light emitting element and a connection pad of a substrate when the inorganic light emitting element is mounted on the substrate through an anisotropic conductive layer, and a display apparatus having the same.

According to an aspect of the present disclosure, a display module is provided. The display module includes a substrate, a thin film transistor (TFT) layer provided on the substrate, a plurality of connection pads provided on the TFT layer, an anisotropic conductive layer provided on the TFT layer, an inorganic light emitting element bonded to the anisotropic conductive layer, and a conductive ball control layer provided in a surrounding area of the plurality of connection pads. The anisotropic conductive layer includes an adhesive layer and a plurality of conductive balls distributed inside the adhesive layer. The inorganic light emitting element includes a plurality of electrodes corresponding to the plurality of connection pads. The conductive ball control layer is configured to restrict the plurality of conductive balls from moving in a direction perpendicular to a bonding direction while the inorganic light emitting element is being bonded to the anisotropic conductive layer.

In some embodiments, the anisotropic conductive layer may be provided on at least a first portion of the plurality of connection pads and at least a second portion of the conductive ball control layer. Alternatively or additionally, at least a third portion of the plurality of connection pads and at least a fourth portion of the conductive ball control layer may be disposed inside the anisotropic conductive layer.

In some embodiments, a first thickness of the conductive ball control layer may be greater than a second thickness of the plurality of connection pads. Alternatively or additionally, the first thickness of the conductive ball control layer may be smaller than a third thickness of the anisotropic conductive layer.

In some embodiments, the conductive ball control layer may be spaced apart from the plurality of connection pads.

In some embodiments, the conductive ball control layer may be provided to surround at least one connection pad of the plurality of connection pads.

In some embodiments, the conductive ball control layer may have been formed of at least one of a polymer material and a photoresist resin material.

In some embodiments, the conductive ball control layer may have been formed on the TFT layer using at least one of a screen printing process, an inkjet process, and a photo process.

In some embodiments, the conductive ball control layer may have been integrally formed with the substrate.

In some embodiments, the conductive ball control layer may have been formed by etching an upper surface of the substrate.

In some embodiments, the adhesive layer may include a first layer and a second layer provided on an upper surface of the first layer. Alternatively or additionally, the plurality of conductive balls may be distributed inside the first layer.

In some embodiments, a first viscosity of the first layer may be greater than a second viscosity of the second layer.

In some embodiments, a first thickness of the first layer may be smaller than a second thickness of the second layer.

According to an aspect of the present disclosure, a display module is provided. The display module includes a substrate, a TFT layer provided on the substrate, a plurality of connection pads provided on the TFT layer, an anisotropic conductive layer provided on the TFT layer, and an inorganic light emitting element bonded to the anisotropic conductive layer. The anisotropic conductive layer includes an adhesive layer and a plurality of conductive balls. The inorganic light emitting element includes a plurality of electrodes corresponding to the plurality of connection pads. The adhesive layer includes a first layer and a second layer provided on an upper side of the first layer. The plurality of conductive balls are distributed inside the first layer.

In some embodiments, a first viscosity of the first layer may be greater than a second viscosity of the second layer.

In some embodiments, a first thickness of the first layer may be smaller than a second thickness of the second layer.

According to an aspect of the present disclosure, a display apparatus is provided. The display apparatus includes a frame and a plurality of display modules installed in an M×N matrix form on the frame. Each display module of the plurality of display modules includes a substrate, a TFT layer provided on the substrate, a plurality of connection pads provided on the TFT layer, an anisotropic conductive layer provided on the TFT layer, an inorganic light emitting element bonded to the anisotropic conductive layer, and a conductive ball control layer provided in a surrounding area of the plurality of connection pads on the TFT layer. The anisotropic conductive layer includes an adhesive layer and a plurality of conductive balls distributed inside the adhesive layer. The inorganic light emitting element includes a plurality of electrodes corresponding to the plurality of connection pads. The conductive ball control layer is configured to restrict the plurality of conductive balls from moving in a direction perpendicular to a bonding direction while the inorganic light emitting element is being bonded to the anisotropic conductive layer.

In some embodiments, the conductive ball control layer may have been formed of at least one of a polymer material and a photoresist resin material. Alternatively or additionally, the conductive ball control layer may have been formed on the TFT layer using at least one of a screen printing process, an inkjet process, and a photo process.

In some embodiments, the conductive ball control layer may been integrally formed with the substrate. Alternatively or additionally, the conductive ball control layer may have been formed by etching an upper surface of the substrate.

In some embodiments, the adhesive layer includes a first layer and a second layer provided on an upper side of the first layer. The plurality of conductive balls may be distributed inside the first layer.

In some embodiments, a first viscosity of the first layer may be greater than a second viscosity of the second layer. Alternatively or additionally, a first thickness of the first layer may be smaller than a second thickness of the second layer.

Additional aspects of the present disclosure are set forth in part in the description which follows and, in part, may be obvious from the description, or may be learned by practice of the disclosure.

BRIEF DESCRIPTION OF THE DRAWINGS

These and/or other aspects of the disclosure will become apparent and more readily appreciated from the following description of embodiments, taken in conjunction with the accompanying drawings of which.

4

Figure 2:
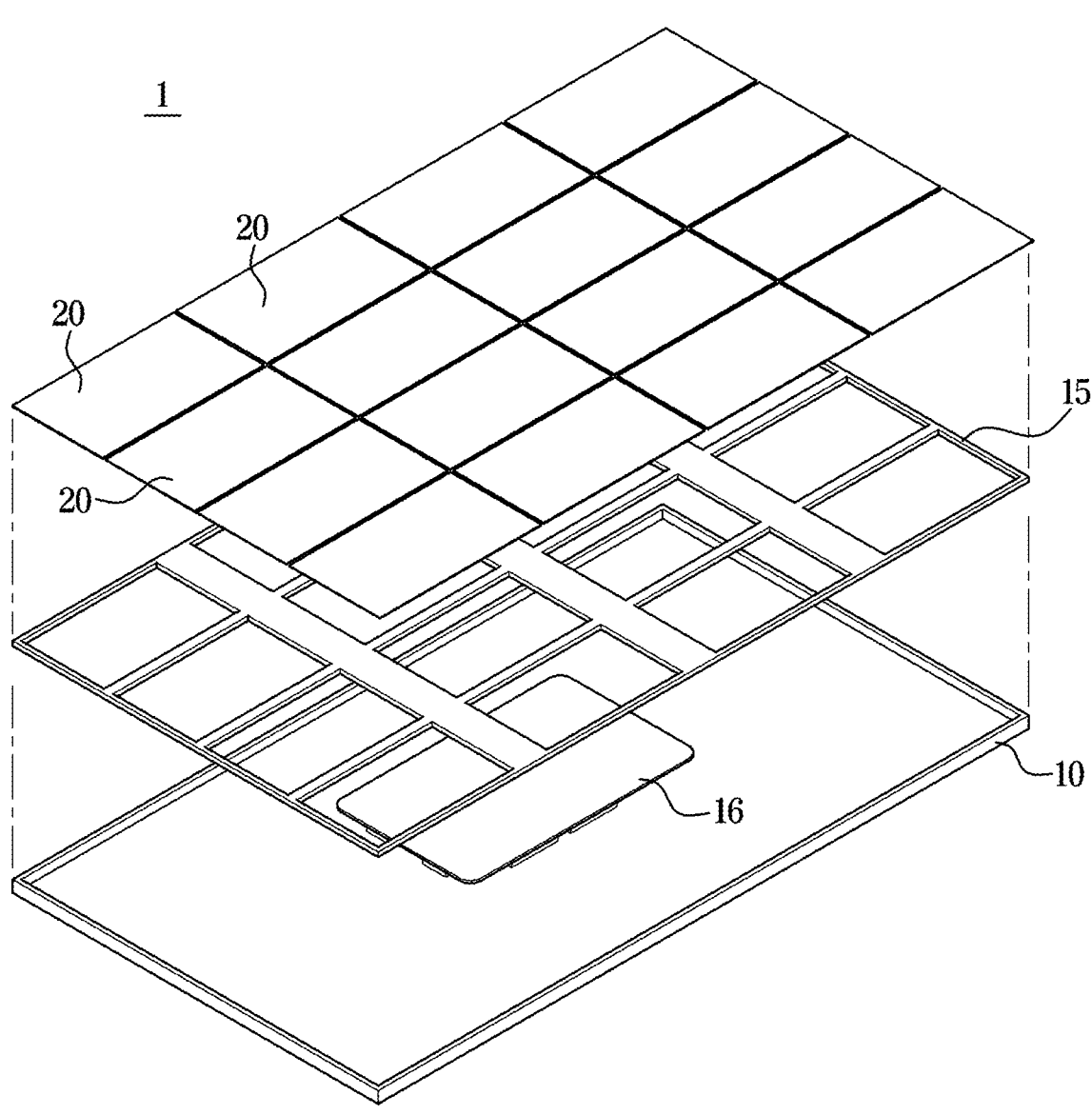
Figure 3A:
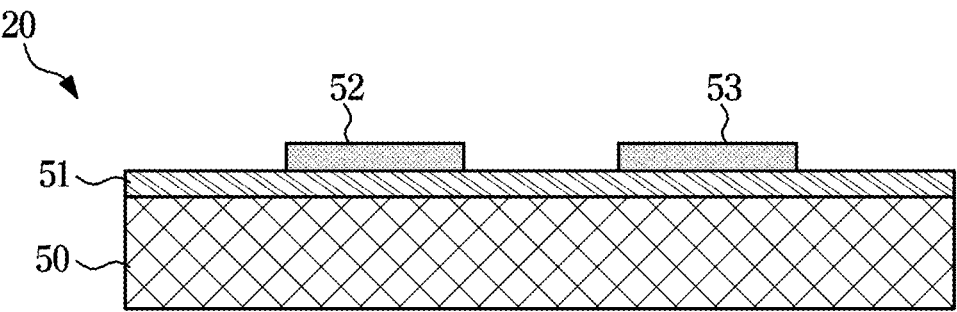
Figure 3B:
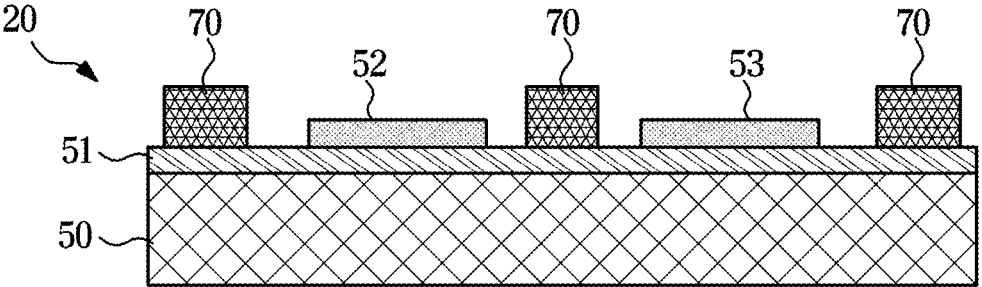
Figure 3C:
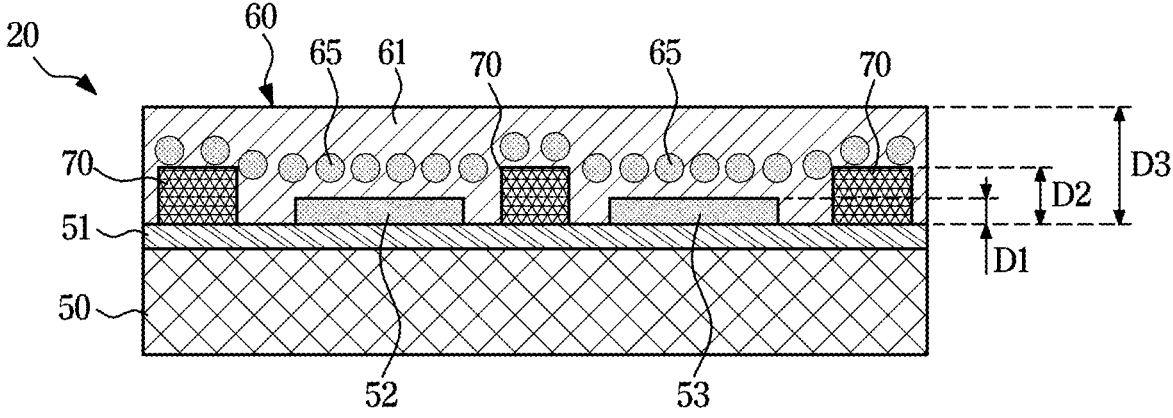
Figure 4:
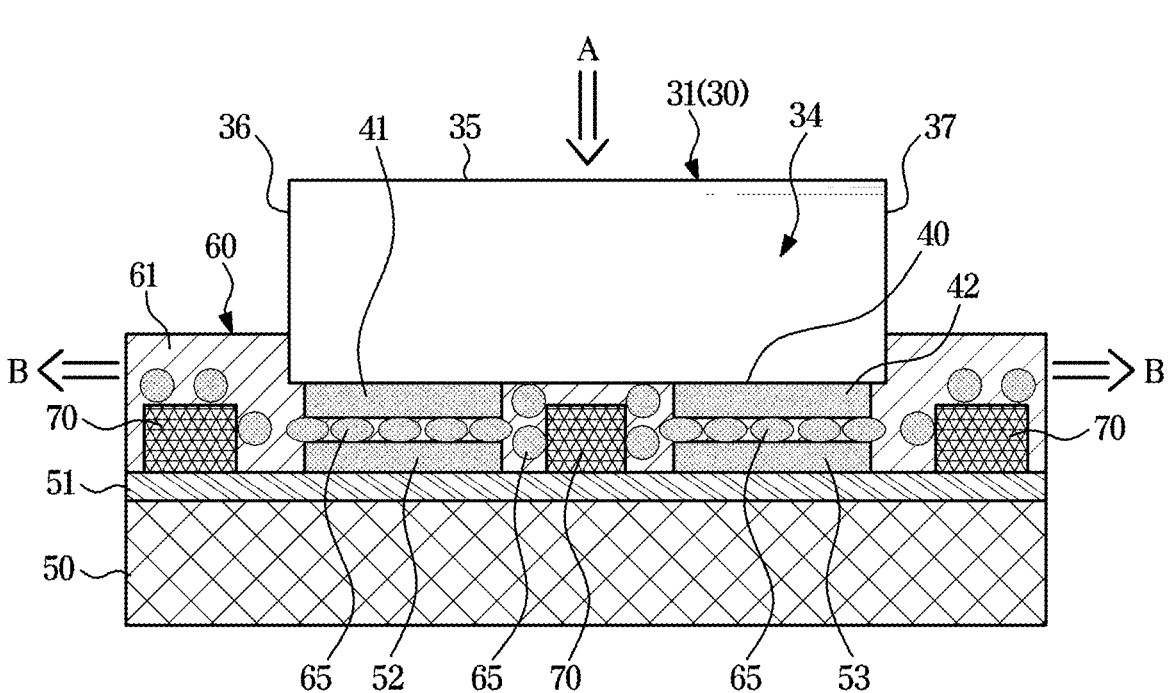
Figure 5:
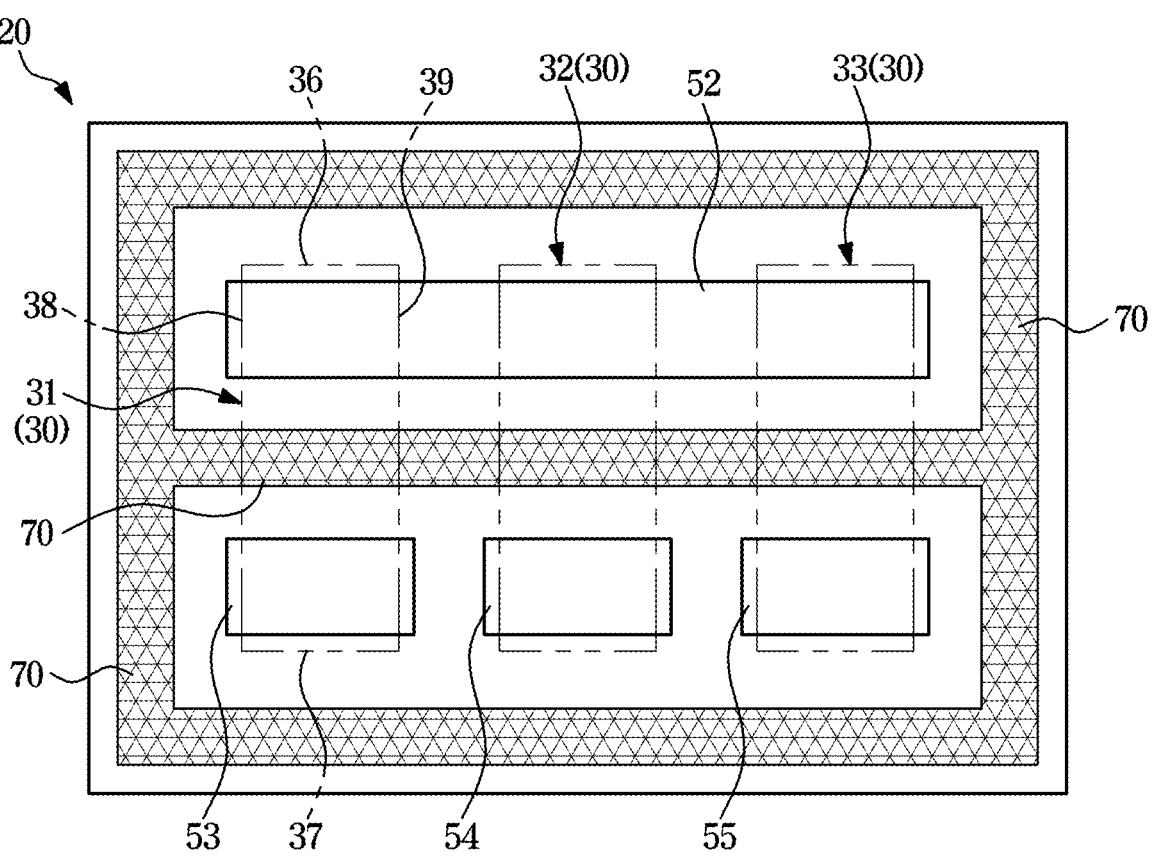
Figure 7:
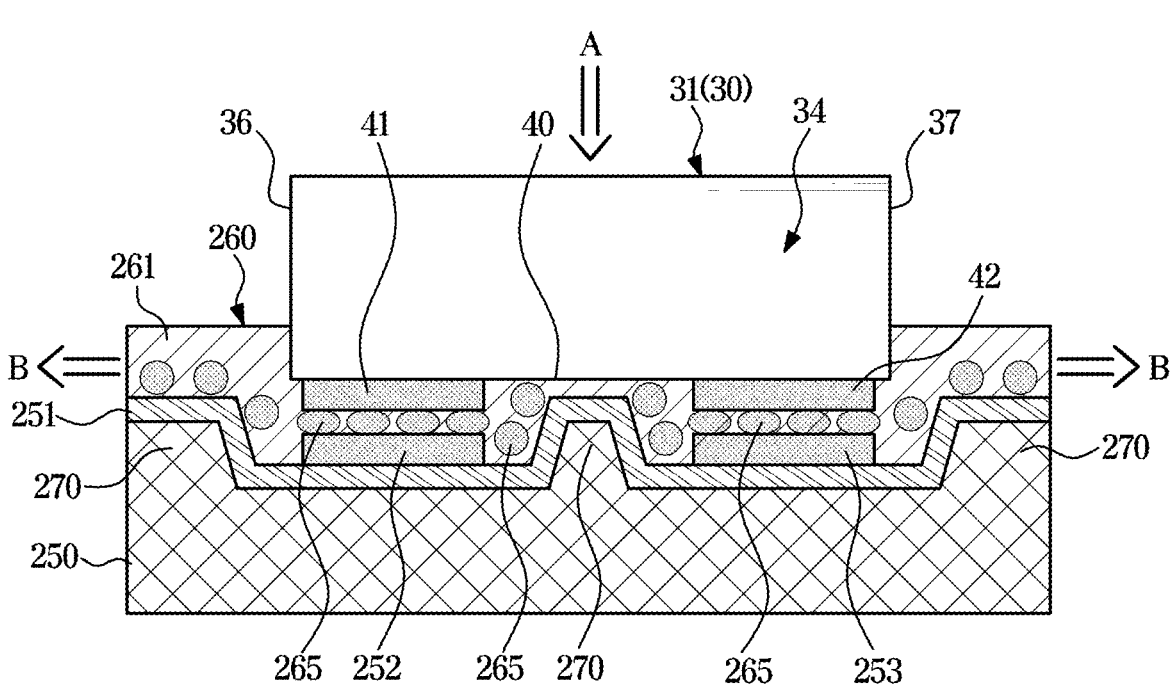
Figure 8A:
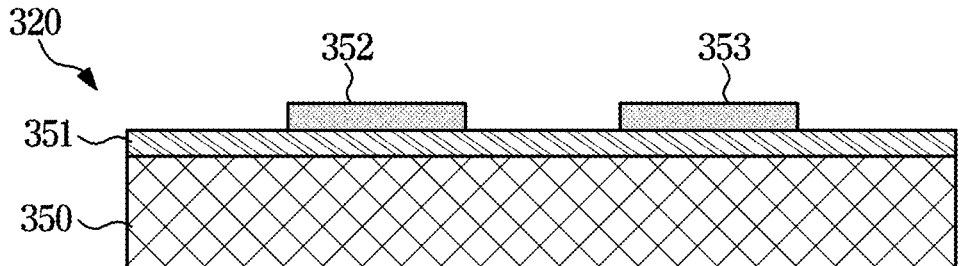
Figure 8B:
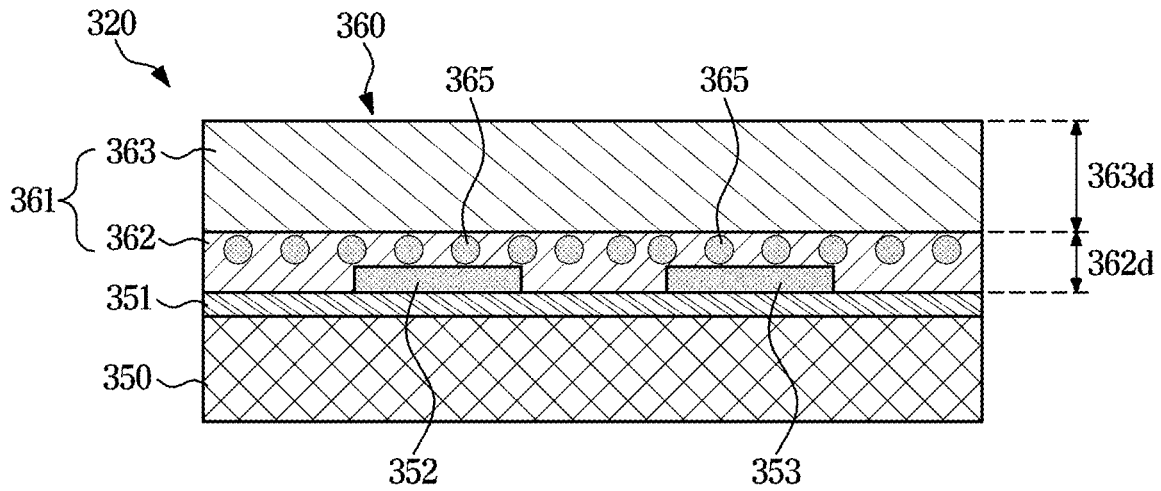
Figure 9:
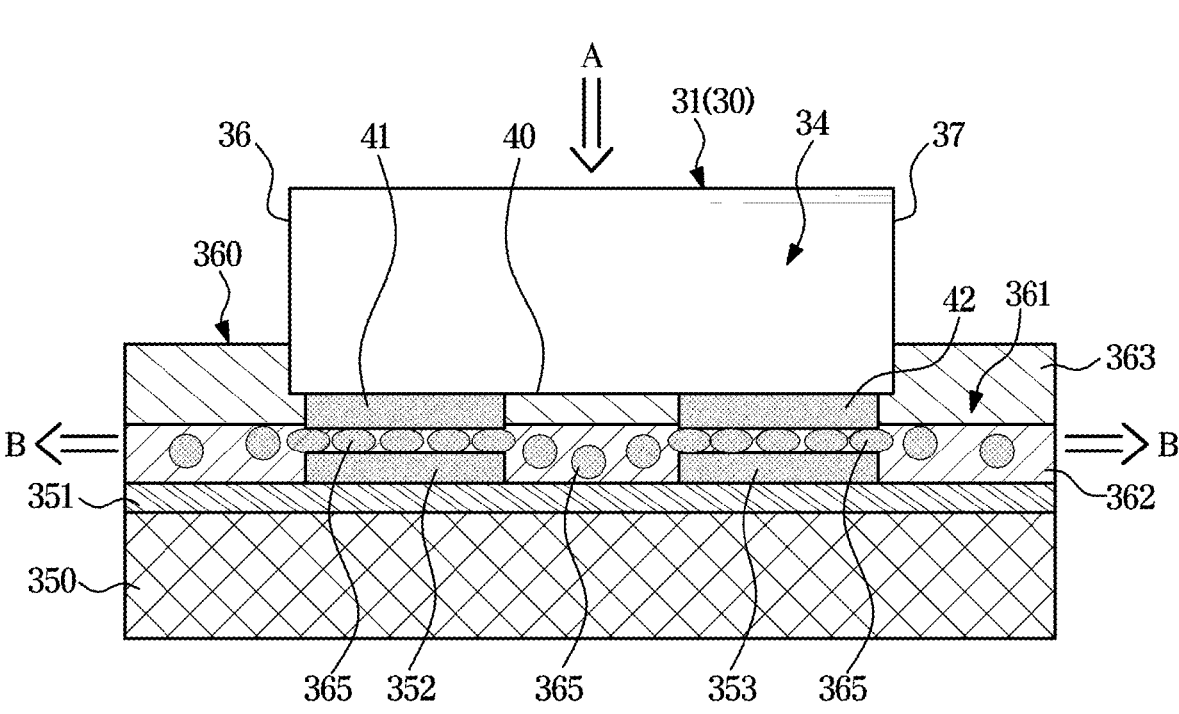
Figure 10A:
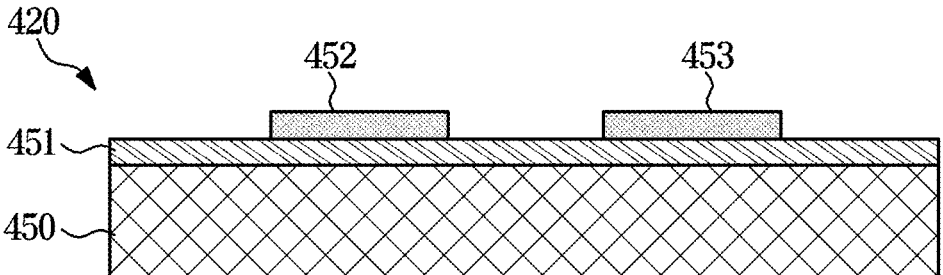
Figure 10B:
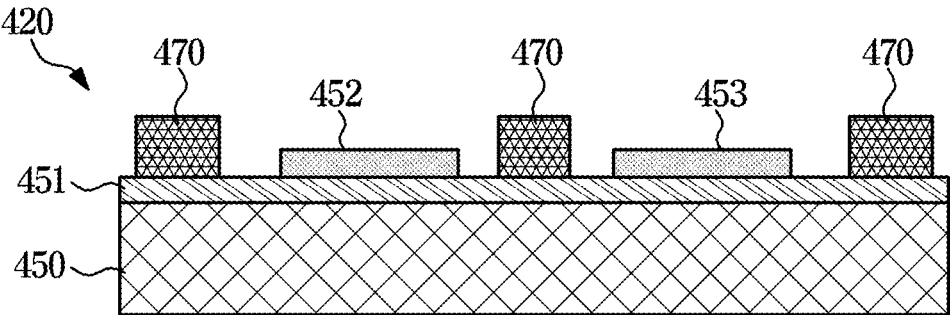
Figure 10C:
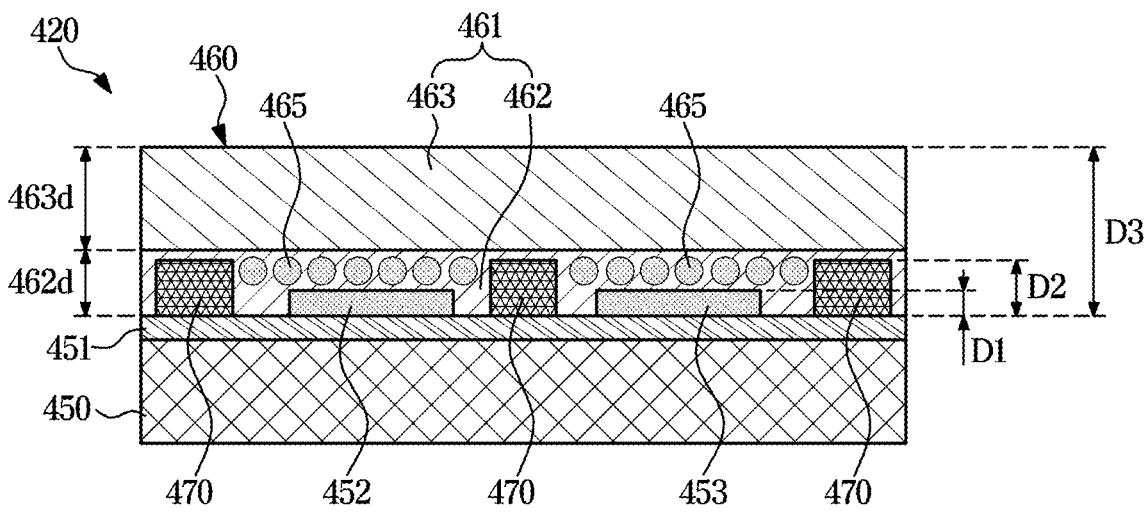
Figure 11:
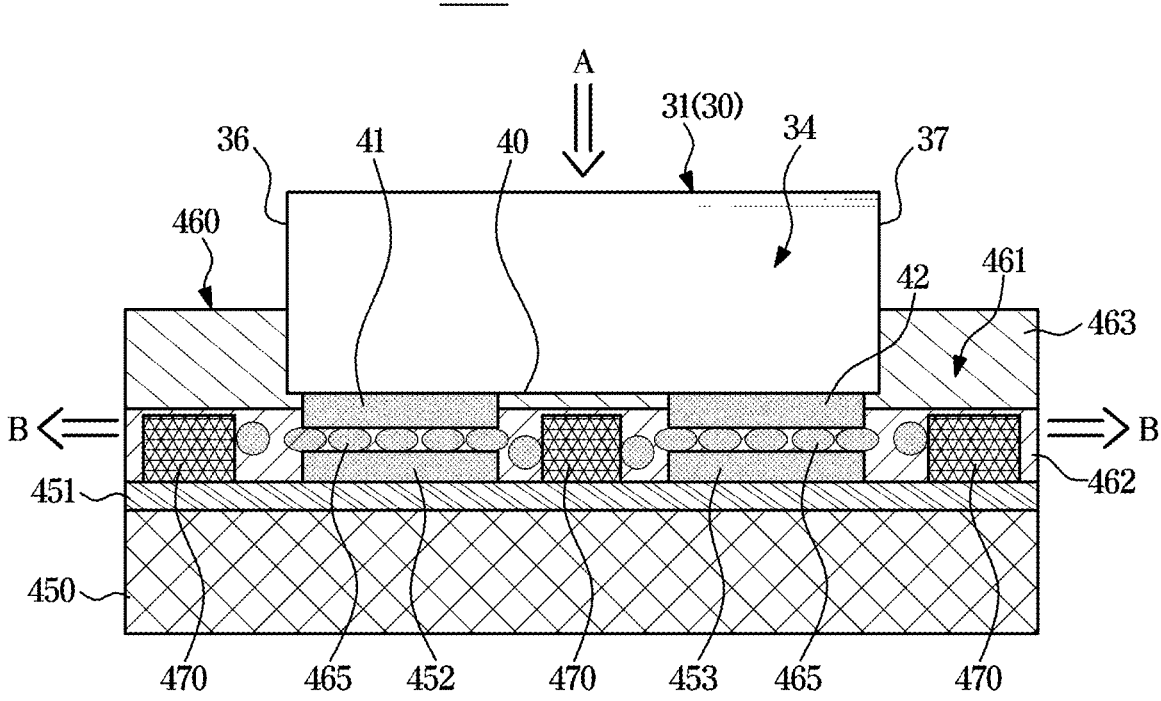
Figure 13:
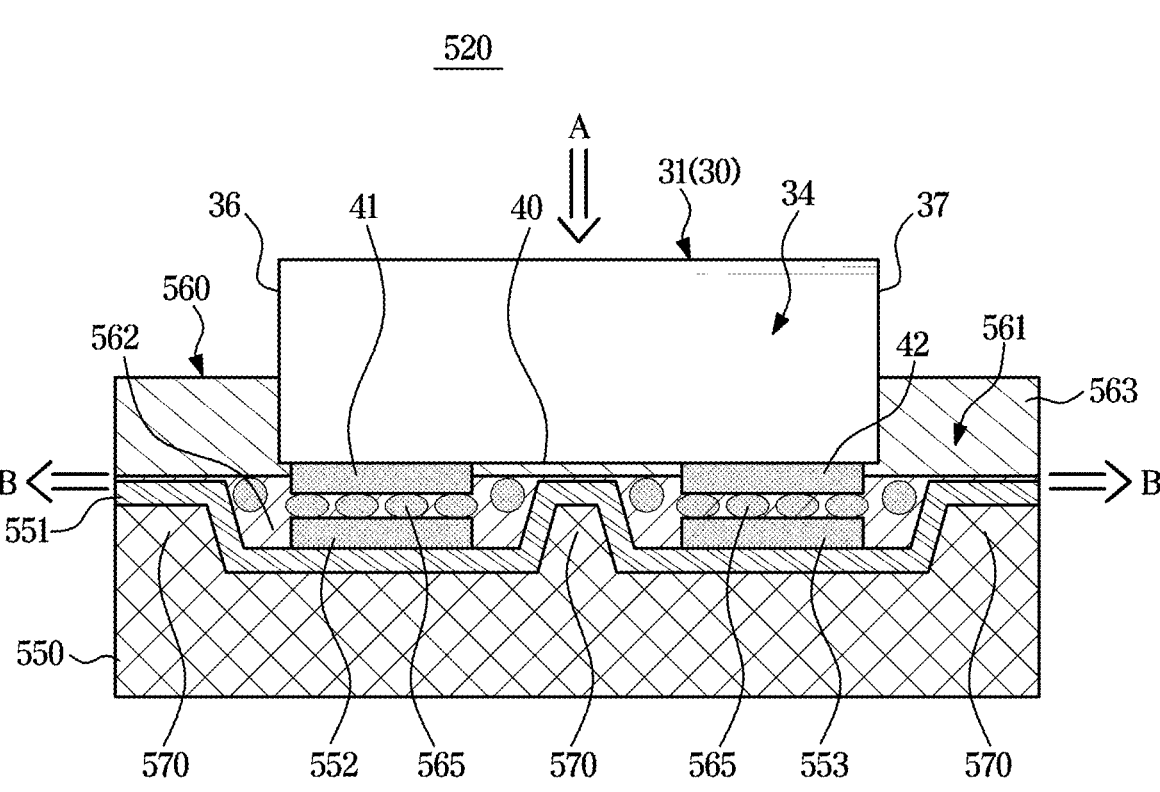
Figure 14:
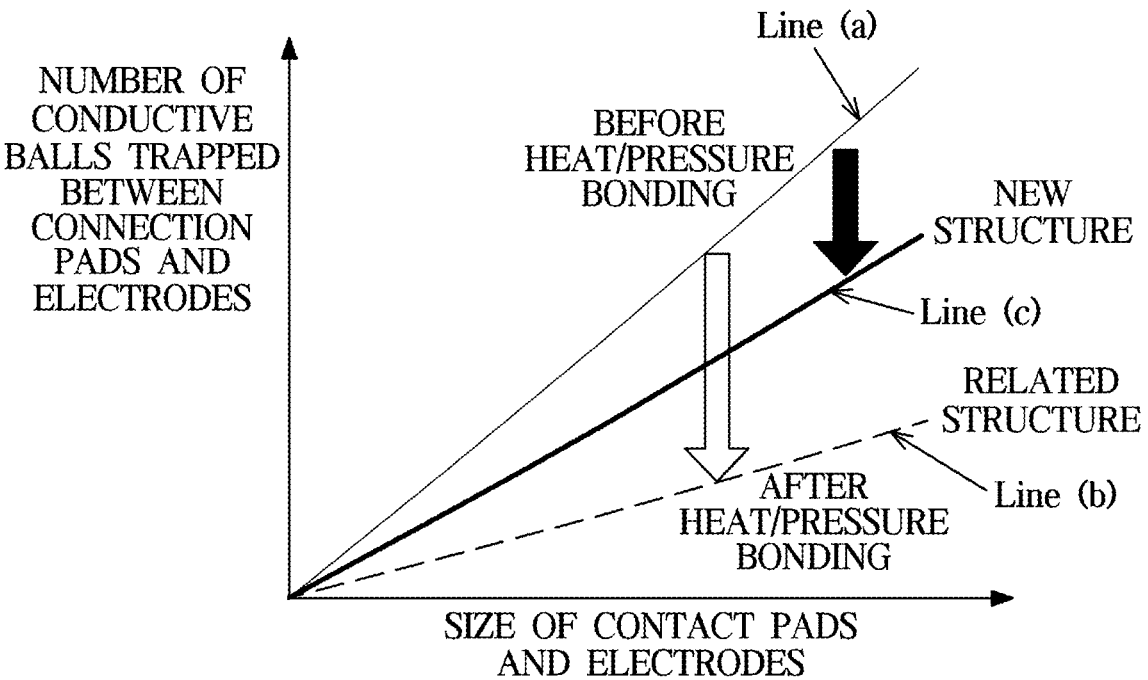

FIG. 2 is an exploded view illustrating a configuration of a display apparatus, according to an embodiment of the present disclosure;

FIGS. 3A, 3B, and 3C are views illustrating exemplary methods of manufacturing a display module, according to various embodiments of the present disclosure;

FIG. 4 is a view illustrating a state in which an inorganic light emitting element is bonded to an anisotropic conductive layer, according to an embodiment of the present disclosure;

FIG. 5 is a plan view illustrating a connection pad and a conductive ball control layer, according to an embodiment of the present disclosure;

FIGS. 6A, 6B, 6C, and 6D are views illustrating exemplary methods of manufacturing a display module, according to various embodiments of the present disclosure;

FIG. 7 is a view illustrating a state in which an inorganic light emitting element is bonded to an anisotropic conductive layer, according to an embodiment of the present disclosure;

FIGS. 8A and 8B are views illustrating exemplary methods of manufacturing a display module, according to an embodiment of the present disclosure;

FIG. 9 is a view illustrating a state in which an inorganic light emitting element is bonded to an anisotropic conductive layer, according to an embodiment of the present disclosure;

FIGS. 10A, 10B, and 10C are views illustrating exemplary methods of manufacturing a display module, according to various embodiments of the present disclosure;

FIG. 11 is a view illustrating a state in which an inorganic light emitting element is bonded to an anisotropic conductive layer, according to an embodiment of the present disclosure;

FIGS. 12A, 12B, 12C, and 12D are views illustrating exemplary methods of manufacturing a display module, according to various embodiments of the present disclosure;

FIG. 13 is a view illustrating a state in which an inorganic light emitting element is bonded to an anisotropic conductive layer, according to an embodiment of the present disclosure; and FIG. 14 is a view illustrating the number of trapped conductive balls between connection pads and electrodes of a display module according to the size of connection pads and electrodes, according to an embodiment of the present disclosure.

DETAILED DESCRIPTION

The embodiments set forth herein and illustrated in the configuration of the disclosure are not the only embodiments and are not representative of the full technical spirit of the disclosure, so it should be understood that they may be replaced with various equivalents and modifications at the time of the disclosure. With regard to the description of the drawings, similar reference numerals may be used to refer to similar or related elements.

It is to be understood that the singular forms "a," "an," and "the" include plural references unless the context clearly dictates otherwise. In the accompanying drawings, the size and relative sizes of elements may be exaggerated for clarity and/or descriptive.

It is to be understood that the terms "include", "comprise" and/or "have" when used in this disclosure, specify the presence of stated features, integers, steps, operations, elements, and/or components, but do not preclude the presence or addition of one or more other features, integers, steps, operations, elements, components, and/or groups thereof.

Through the present disclosure, the expression of an ordinal number, such as, but not limited to, "first" and "second", may be used to distinguish a plurality of members, and the used ordinal number does not indicate an arrangement order, a manufacturing order, importance, and the like of the members.

The singular expression includes a plural expression unless there are obvious exceptions in the context.

It is to be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

Hereinafter, embodiments of the present disclosure are described with reference to the accompanying drawings.

Figure 1:
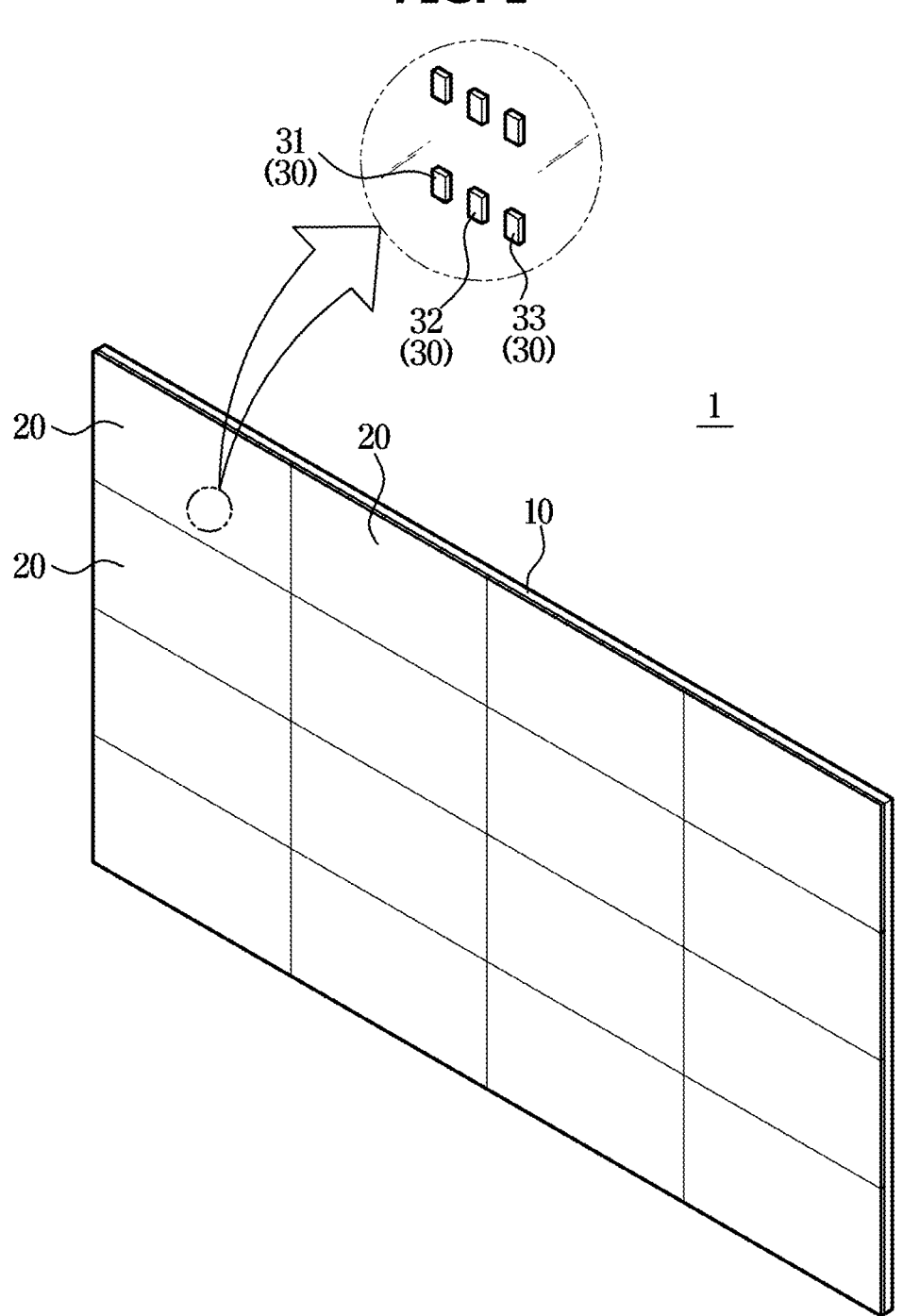
FIG. 1 is a view illustrating an appearance of a display apparatus, according to an embodiment of the present disclosure.

FIG. 1 is a view illustrating an appearance of a display apparatus, according to an embodiment of the present disclosure. FIG. 2 is an exploded view illustrating a configuration of a display apparatus, according to an embodiment of the present disclosure.

Components of a display apparatus 1 including a plurality of inorganic light emitting elements 30 (e.g., first light emitting element 31, second light emitting element 32, and third light emitting element 33), as shown in the drawings, may be components in micro-units having a size of several micrometers (μm) to several hundreds of μm. The sizes of some components may be exaggerated for the sake of convenience of description.

Referring to FIGS. 1 and 2, the display apparatus 1 may include a device that displays information, material, data, and the like, such as, but not limited to, characters, figures, graphs, images, and the like. In some embodiments, the display apparatus 1 may be implemented as a television (TV), a personal computer (PC), a mobile device (e.g., smartphone, tablet, wearable device, portable device, handheld device, user equipment), a digital signage, and the like.

The display apparatus 1 may include a plurality of display modules 20 configured to display an image, a power supply device (not shown) configured to supply power to the plurality of display modules 20, a main board 16 configured to control the overall operation of the plurality of display modules 20, a frame 15 supporting the plurality of display modules 20, and a rear cover 10 covering a rear surface of the frame 15. The rear cover 10 may be installed on the floor through a stand (not shown) or installed on a wall through a hanger (not shown).

The plurality of display modules 20 may be arranged in upper to lower direction and left to right direction so as to be adjacent to each other. Alternatively or additionally, the plurality of display modules 20 may be arranged in an M×N matrix form. In an embodiment, the display modules 20 may be provided as sixteen (16) display modules 20 and may be arranged in a 4×4 matrix form. However, the present disclosure is not limited in this regard. For example, the number of display modules in the plurality of display modules 20 and/or arrangement method of the plurality of display modules 20 may vary without deviating from the scope of the present disclosure.

The plurality of display modules 20 may be installed on the frame 15. The plurality of display modules 20 may be installed on the frame 15 through various known methods, such as, but not limited to, a magnetic force method using a magnet and/or a mechanical fitting structure. The rear cover 10 may be coupled to the rear of the frame 15. That is, the rear cover 10 may form the rear appearance of the display apparatus 1.

The rear cover 10 may include a metal material. Accordingly, heat generated from the plurality of display modules 20 and the frame 15 may be conducted to the rear cover 10 to increase a heat dissipation efficiency of the display apparatus 1.

As described above, the display apparatus 1, according to an embodiment, may implement a large screen by tiling the plurality of display modules 20.

According to optional or additional embodiments of the present disclosure, a single display module 20 may be applied to the display apparatus 1. That is, the display module 20 may be installed and applied to wearable devices, portable devices, handheld devices, and other various electronic product or machine parts that may require a display as a single unit.

In some embodiments, the plurality of display modules 20 may have the same configuration. Therefore, the following description of one display module may be equally applicable to all other display modules of the plurality of display modules 20.

Each of the display modules 20 may include a plurality of inorganic light emitting elements 30. Each of the plurality of inorganic light emitting elements 30 (e.g., the first light emitting element 31, the second light emitting element 32, and the third light emitting element 33) may form a subpixel. The plurality of inorganic light emitting elements 30 may include a red (R) inorganic light emitting element 31, a green (G) inorganic light emitting element 32, and a blue (B) inorganic light emitting element 33.

In some embodiments, a pixel may be formed by a combination of at least three sub-pixels outputting light of different colors. For example, a pixel P may include three sub-pixels corresponding to R, G, and B, respectively. As described herein, the red (R) sub-pixel may output red light, the green (G) sub-pixel may output green light, and the blue (B) sub-pixel may output blue light. For example, the red (R) subpixel may include the red (R) inorganic light emitting element 31, the green (G) subpixel may include the green (G) inorganic light emitting element 32, and the blue (B) subpixel may include the blue (B) inorganic light emitting element 22.

The red (R) inorganic light emitting element 31, the green (G) inorganic light emitting element 32, and the blue (G) inorganic light emitting element 33 may be arranged in a line at predetermined intervals, as shown in FIG. 1. However, the arrangement of the plurality of inorganic light emitting elements 30 is not limited in this regard. For example, the plurality of inorganic light emitting elements 30 may be arranged in other shapes, such as, but not limited to, a triangular shape, without deviating from the scope of the present disclosure.

As described above, one pixel may include three subpixels corresponding to R, G, and B, respectively. However, the present disclosure is not limited in this regard. For example, a pixel may include two sub-pixels (e.g., R and G, G and B, and/or B and R), three sub-pixels (e.g., R, B, and white (W)), four sub-pixels (e.g., R, G, B, and W), and/or more sub-pixels, without deviating from the scope of the present disclosure.

FIGS. 3A, 3B, and 3C are views illustrating exemplary methods of manufacturing a display module, according to various embodiments of the present disclosure. FIG. 4 is a view illustrating a state in which an inorganic light emitting element is bonded to an anisotropic conductive layer, according to an embodiment of the present disclosure. FIG. 5 is a plan view illustrating a connection pad and a conductive ball control layer, according to an embodiment of the present disclosure.

Referring to FIGS. 3A to 3C, 4, and 5, the display module 20 may include a substrate 50, a thin film transistor (TFT) layer 51 provided on the substrate 50, a plurality of connection pads (e.g., first connection pad 52, second connection pad 53, third connection pad 54, and fourth connection pad 55) provided on the TFT layer 51, an anisotropic conductive layer 60 provided on the TFT layer 51, and a plurality of inorganic light emitting elements 30 bonded to an upper side of the anisotropic conductive layer 60.

The substrate 50 may form the skeleton of the display module 20 and may be formed of a glass material. However, the present disclosure is not limited in this regard. For example, according to various embodiments, the substrate 50 may be formed of polyimide, polyethylene terephthalate (PET), flame retardant 4 (FR4), and the like.

The TFT layer 51 may be formed on the upper surface of the substrate 50 and may include a TFT circuit (not shown). The TFT layer 51 may include a plurality of pixel areas. Each pixel area of the TFT layer 51 may be provided with a pixel circuit for driving a sub-pixel.

The pixel circuit may be electrically connected (e.g., coupled) to a corresponding one of the inorganic light emitting elements (e.g., first light emitting element 31, second light emitting element 32, and third light emitting element 33) and may control the corresponding one of the inorganic light emitting elements (e.g., first light emitting element 31, second light emitting element 32, and third light emitting element 33) to be turned on or off.

The substrate 50 may be provided with a driving circuit (not shown) formed on a lower surface of the substrate 50 to drive the TFT circuit. Alternatively or additionally, the substrate 50 may include a side wiring (not shown) formed on a side surface of the substrate 50 to electrically connect (e.g., couple) the TFT circuit of the TFT layer 51 to the driving circuit.

The plurality of connection pads (e.g., first connection pad 52, second connection pad 53, third connection pad 54, and fourth connection pad 55) may be electrically connected (e.g., coupled) to the TFT circuit of the TFT layer 51. The plurality of connection pads may include a first connection pad 52, to which electrodes of the plurality of inorganic light emitting elements 30 (e.g., first light emitting element 31, second light emitting element 32, and third light emitting element 33) may be connected in common. Alternatively or additionally, the plurality of connection pads may include second connection pad 53, third connection pad 54, and fourth connection pad 55 to which the plurality of inorganic light emitting elements 30 (e.g., first light emitting element 31, second light emitting element 32, and third light emitting element 33) may be respectively connected.

In some embodiments, the anisotropic conductive layer 60 may include an anisotropic conductive film (ACF) in the form of a film and an anisotropic conductive paste (ACP) in the form of a paste.

The anisotropic conductive layer 60 may be provided on the TFT layer 51 to cover at least a portion of the first and second connection pads 52 and 53. That is, at least a portion of the first and second connection pads 52 and 53 may be buried in (e.g., disposed inside of) the anisotropic conductive layer 60.

The anisotropic conductive layer 60 may include an adhesive layer 61 and a plurality of conductive balls 65 distributed inside the adhesive layer 61. The adhesive layer 61 may not conduct electricity and may be formed of a thermoplastic material that may deform by heating. For example, the adhesive layer 61 may be formed of at least one of styrene butadiene, polyvinyl butylene, and the like. However, the present disclosure is not limited in this regard. That is, the adhesive layer 61 may be formed of other materials and/or compounds with similar characteristics without deviating from the scope of the disclosure.

The plurality of conductive balls 65 may be conductive particles surrounded by a thin insulating film. The plurality of conductive balls 65 may be formed such that, when the insulating film is broken by a pressure, an electrical connection occurs between conductive balls 65. In some embodiments, the plurality of conductive balls may formed using metal materials, such as, but not limited to, gold (Au), nickel (Ni), and palladium (Pd). However, the present disclosure is not limited in this regard. That is, the plurality of conductive balls 65 may be formed of other conductive materials and/or compounds without deviating from the scope of the disclosure.

Each of the plurality of inorganic light emitting elements 30 may be formed of an inorganic material. Each of the plurality of inorganic light emitting elements 30 may be formed to have dimensions (e.g., a width, a length, and/or a height), ranging from approximately several μm to approximately several tens of μm. For example, an inorganic light emitting element of the plurality of inorganic light emitting elements 30 may have a short side of 100 μm or less among the width, the length, and the height.

In some embodiments, each of the plurality of inorganic light emitting elements 30 may be picked up from a sapphire and/or a silicon wafer and transferred directly onto the substrate 50. For example, each of the plurality of inorganic light emitting elements 30 may be picked up and transported through an electrostatic method using an electrostatic head and/or a stamp method using an elastic polymer material, such as, but not limited to, polydimethylsiloxane (PDMS) or silicon, as a head.

Each of the plurality of light emitting elements 30 may include a light emitting structure 34 having an n-type semiconductor, an active layer, a p-type semiconductor, and a pair of electrodes (e.g., first electrode 41 and second electrode 42) provided on a bottom surface 40 of the light emitting structure 34. In some embodiments, the light emitting structure 34 may be formed in a substantially hexahedral shape. That is, the light emitting structure 34 may have a top surface 35, a bottom surface 40, and side surfaces (e.g., first side surface 36, second side surface 37, third side surface 38, and fourth side surface 39). Since the pair of electrodes (e.g., first electrode 41 and second electrode 42) may be disposed to face in the same direction on the bottom surface 40 of the light emitting structure 34, the inorganic light emitting element 30 may be referred to as having a flip chip structure.

The pair of first and second electrodes 41 and 42 may correspond to a pair of connection pads (e.g., first and second connection pads 52 and 53). The pair of first and second electrodes 41 and 42 may include a cathode 41 and an anode 42. For example, the cathode 41 and the anode 42 may be provided at both ends of the inorganic light emitting element 30 in the longitudinal direction, respectively. The cathode 41 and the anode 42 may be electrically connected (e.g., coupled) to the first connection pad 52 and the second connection pad 53 through the anisotropic conductive layer 60, respectively.

When the inorganic light emitting element 30 is pressed toward the anisotropic conductive layer 60 while heat is being applied to the anisotropic conductive layer 60, the adhesive layer 61 may be compressed and the plurality of conductive balls 65 may be brought into contact with the pair of first and second electrodes 41 and 42 and the first and second connection pads 52 and 53, so that the pair of first and second electrodes 41 and 42 may be electrically connected (e.g., coupled) to the first and second connection pads 52 and 53.

However, during the bonding process, a portion of the plurality of conductive balls 65 located in an area, to which a pressure is applied, may move in a direction B perpendicular to a bonding direction A, escaping outside of a space between the pair of first and second electrodes 41 and 42 and the first and second connection pads 52 and 53. As such, when the portion of the plurality of conductive balls 65 escape to the outside of the space between the pair of first and second electrodes 41 and 42 and the first and second connection pads 52 and 53, the number of the conductive balls 65 that come in contact with the pair of first and second electrodes 41 and 42 and the first and second connection pads 52 and 53 may be reduced. As a result, current may not flow between the pair of first and second electrodes 41 and 42 and the first and second connection pads 52 and 53, and/or the current may flow insufficiently.

According to the embodiment, the display module 20 may include a conductive ball control layer 70 provided to restrict the escape of the plurality of conductive balls 65 during the bonding process and, thereby, supply a sufficient amount of current to drive the inorganic light emitting element 30.

That is, the conductive ball control layer 70 may restrict the plurality of conductive balls 65 from moving in the direction B perpendicular to the bonding direction A in a process of the plurality of inorganic light emitting elements 30 being bonded to the anisotropic conductive layer 60. The conductive ball control layer 70 may be provided in a surrounding area of the plurality of connection pads (e.g., the first connection pad 52, the second connection pad 53, the third connection pad 54, and the fourth connection pad 55) on the TFT layer 51.

The anisotropic conductive layer 60 may be provided on the TFT layer 51 to cover at least a portion the conductive ball control layer 70. That is, at least a portion the conductive ball control layer 70 may be buried in (e.g., disposed inside of) the anisotropic conductive layer 60.

In some embodiments, the conductive ball control layer 70 may have a thickness D2 greater than a thickness D1 of the first and second connection pads 52 and 53. Alternatively or additionally, the thickness D2 of the conductive ball control layer 70 may be smaller than a thickness D3 of the anisotropic conductive layer 60. Thus, the plurality of conductive balls 65 may be physically restricted from escaping outside of the space between the pair of first and second electrodes 41 and 42 and the first and second connection pads 52 and 53 during the bonding process.

The conductive ball control layer 70 may be formed to be spaced apart from the first and second connection pads 52 and 53.

The conductive ball control layer 70 may be formed to surround at least one of the plurality of connection pads (e.g., the first connection pad 52, the second connection pad 53, the third connection pad 54, and the fourth connection pad 55). That is, as shown in FIG. 5, the conductive ball control layer 70 may be formed to surround the common (e.g., first) connection pad 52. Alternatively or additionally, the conductive ball control layer 70 may be formed to surround the second connection pad 53, the third connection pad 54, and the fourth connection pad 55.

In some embodiments, the conductive ball control layer 70 may be formed of a polymer material. In optional or additional embodiments, the conductive ball control layer 70 may be formed through (e.g., using) a screen printing process and/or an inkjet process. Alternatively or additionally, the conductive ball control layer 70 may be formed of a photoresist resin material. Alternatively or additionally, the conductive ball control layer 70 may be formed through a photo-lithography process. However, the present disclosure is not limited in this regard. For example, the conductive ball control layer 70 may be formed of various materials and/or compounds using one or more fabrication processes without deviating from the scope of the present disclosure.

A method of manufacturing the display module 20 may include forming the TFT layer 51 and the first and second connection pads 52 and 53 on the substrate 50, as shown in FIG. 3A. The method of manufacturing the display module 20 may further include forming the conductive ball control layer 70 on the TFT layer 51, as shown in FIG. 3B. The method of manufacturing the display module 20 may further include forming the anisotropic conductive layer 60 on the TFT layer 51 to cover at least a portion of the first and second connection pads 52 and 53 and at least a portion of the conductive ball control layer 70, as shown in FIG. 3C.

The method of manufacturing the display module 20 may further include applying heat to the anisotropic conductive layer 60 while pressing the inorganic light emitting element 30 toward the anisotropic conductive layer 60, as shown in FIG. 4). In response to the inorganic light emitting element 30 being pressed toward the anisotropic conductive layer 60, the plurality of conductive balls 65 may be blocked by the conductive ball control layer 70 and may be restricted from moving in the direction B perpendicular to the bonding direction A. As a result, a larger number of conductive balls 65 may come into contact with the pair of first and second electrodes 41 and 42 and the first and second connection pads 52 and 53, which may supply a sufficient amount of current to drive the inorganic light emitting element 30.

FIGS. 6A, 6B, 6C, and 6D are views illustrating exemplary methods of manufacturing a display module, according to various embodiments of the present disclosure. FIG. 7 is a view illustrating a state in which an inorganic light emitting element is bonded to an anisotropic conductive layer, according to an embodiment of the present disclosure.

The display module 220 of FIGS. 6A to 6D and 7 may include or may be similar in many respects to the display module 20 of FIGS. 3A to 3C, 4, and 5, and may include features not mentioned above. Hereinafter, the same reference numerals are assigned to the same configurations as those in the above-described embodiment, and detailed description thereof may be omitted.

Referring to FIGS. 6A to 6D and 7, the display module 220 may include a substrate 250, a TFT layer 251 provided on the substrate 250, a plurality of connection pads (e.g., first connection pad 252 and second connection pad 253) provided on the TFT layer 251, an anisotropic conductive layer 260 provided on the TFT layer 251, and a plurality of inorganic light emitting elements 30 bonded to an upper side of the anisotropic conductive layer 260.

The anisotropic conductive layer 260 may be provided on the TFT layer 251 to cover at least a portion the first and second connection pads 252 and 253. That is, at least a portion of the first and second connection pads 252 and 253 may be buried in (e.g., disposed inside of) the anisotropic conductive layer 260.

The anisotropic conductive layer 260 may include an adhesive layer 261 and a plurality of conductive balls 265 distributed inside the adhesive layer 261.

When the inorganic light emitting element 30 is pressed toward the anisotropic conductive layer 260 while heat is being applied to the anisotropic conductive layer 260, the adhesive layer 261 may be compressed and the plurality of conductive balls 265 may be brought into contact with the pair of first and second electrodes 41 and 42 and the first and second connection pads 252 and 253. As a result, the pair of first and second electrodes 41 and 42 may be electrically connected (e.g., coupled) to the first and second connection pads 252 and 253.

The display module 220 may include a conductive ball control layer 270 provided to restrict the escape of the plurality of conductive balls 265 during the bonding process and to supply a sufficient amount of current to drive the inorganic light emitting element 30.

In some embodiments, the conductive ball control layer 270 may have a thickness D2 greater than a thickness D1 of the first and second connection pads 252 and 253. Alternatively or additionally, the thickness D2 of the conductive ball control layer 270 may be smaller than a thickness D3 of the anisotropic conductive layer 260.

In some embodiments, the conductive ball control layer 270 may be integrally formed with the substrate 250. That is, the conductive ball control layer 270 may be formed of the same material as material forming the substrate 250. For example, the conductive ball control layer 270 may be formed by physically and/or chemically etching an upper surface of the substrate 250.

Figure 6A:
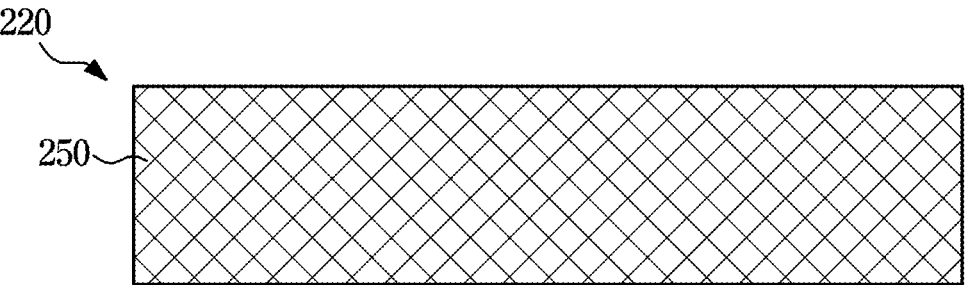
Figure 6B:
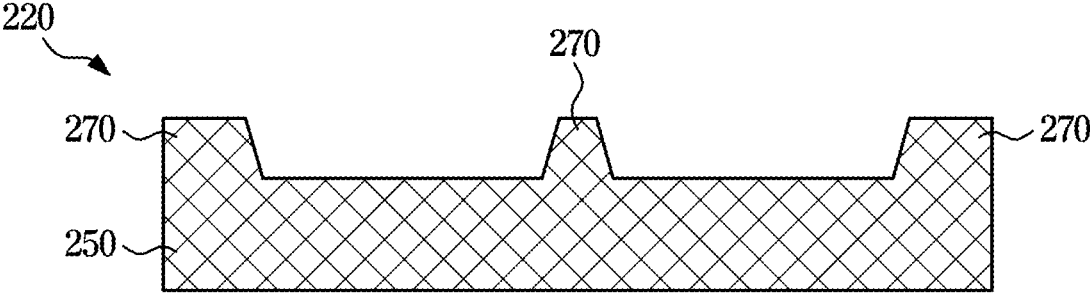
Figure 6C:
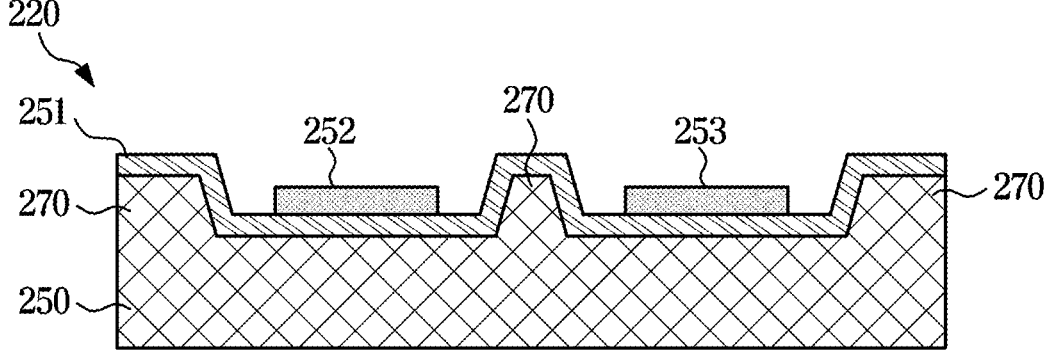
Figure 6D:
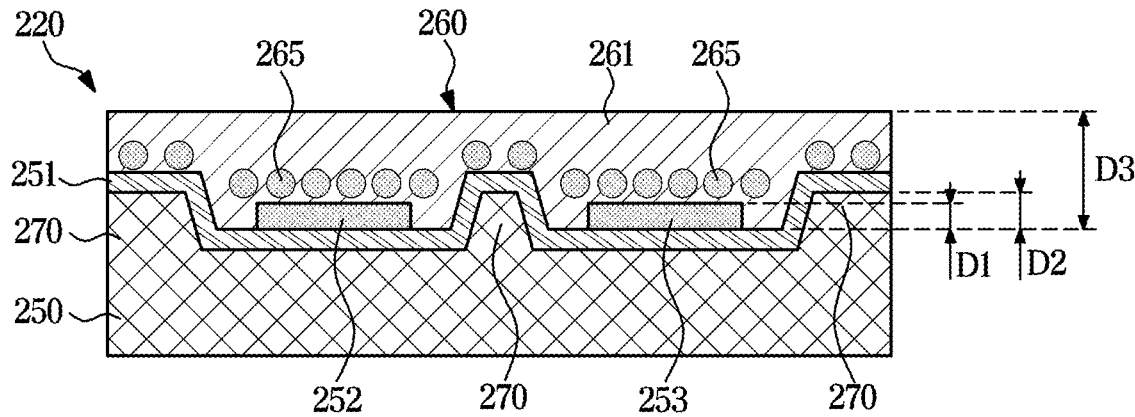

A method of manufacturing the display module 220 may include forming the conductive ball control layer 270 by etching an upper surface of a substrate 250, as shown in FIG. 6B. The method of manufacturing the display module 220 may further include forming the TFT layer 251 and the first and second connection pads 252 and 253 on the substrate 250, as shown in FIG. 6C. The method of manufacturing the display module 220 may further include forming the anisotropic conductive layer 260 on the TFT layer 251 to cover at least a portion the first and second connection pads 252 and 253 and at least a portion of the conductive ball control layer 270, as shown in FIG. 6D.

The method of manufacturing the display module 220 may further include applying heat to the anisotropic conductive layer 260 while pressing the inorganic light emitting element 30 toward the anisotropic conductive layer 260, as shown in FIG. 7. In response to the inorganic light emitting element 30 being pressed toward the anisotropic conductive layer 260, the plurality of conductive balls 265 may be blocked by the conductive ball control layer 270 and may be restricted from moving in the direction B perpendicular to the bonding direction A. As a result, a larger number of conductive balls 265 may come into contact with the pair of first and second electrodes 41 and 42 and the first and second connection pads 252 and 253, which may supply a sufficient amount of current to drive the inorganic light emitting element 30.

FIGS. 8A and 8B are views illustrating exemplary methods of manufacturing a display module, according to various embodiments of the present disclosure. FIG. 9 is a view illustrating a state in which an inorganic light emitting element is bonded to an anisotropic conductive layer, according to an embodiment of the present disclosure.

The display module 320 of FIGS. 8A, 8B, and 9 may include or may be similar in many respects to at least one of the display module 20 of FIGS. 3A to 3C, 4, and 5, and the display module 220 of FIGS. 6A to 6D and 7, and may include features not mentioned above.

Referring to FIGS. 8A, 8B, and 9, the display module 320 may include a substrate 350, a TFT layer 351 provided on the substrate 350, a plurality of connection pads (e.g., first connection pad 352 and second connection pad 353) provided on the TFT layer 351, an anisotropic conductive layer 360 provided on the TFT layer 351, and a plurality of inorganic light emitting elements 30 bonded to an upper side of the anisotropic conductive layer 360.

The anisotropic conductive layer 360 may be provided on the TFT layer 351 to cover at least a portion of the first and second connection pads 352 and 353. That is, at least a portion of the first and second connection pads 352 and 353 may be buried in (e.g., disposed inside of) the anisotropic conductive layer 360.

The anisotropic conductive layer 360 may include an adhesive layer 361 and a plurality of conductive balls 365 distributed inside the adhesive layer 361.

When the inorganic light emitting element 30 is pressed toward the anisotropic conductive layer 360 while heat is being applied to the anisotropic conductive layer 360, the adhesive layer 361 may be compressed and the plurality of conductive balls 365 may be brought into contact with the pair of first and second electrodes 41 and 42 and the first and second connection pads 352 and 353, and the pair of first and second electrodes 41 and 42 may be electrically connected (e.g., coupled) to the first and second connection pads 352 and 353.

The adhesive layer 361 may have a two-layer structure. That is, the adhesive layer 361 may include a first layer 362 and a second layer 363 provided on the upper side of the first layer 362. In some embodiments, conductive balls 365 may be provided to be distributed inside the first layer 362. That is, in some embodiments, the plurality of conductive balls 365 may not be provided inside the second layer 363.

In some embodiments, the first layer 362 may have a higher viscosity than a viscosity of the second layer 363. For example, the first layer 362 may be formed of a material having a higher viscosity than a viscosity of the second layer 363 at a temperature at which the adhesive layer 361 starts to melt (e.g., due to heat applied to the display module 320). That is, the first layer 362 may have a lower fluidity than a fluidity of the second layer 363. Alternatively or additionally, the first layer 362 may have a thickness 362d smaller than a thickness 363d of the second layer 363.

As described above, when the first layer 362 has a higher viscosity than that of the second layer 363, and the thickness 362d of the first layer 362 is smaller than the thickness 363d of the second layer 363, the plurality of conductive balls 365 distributed inside the first layer 362 may be restricted from moving from the first layer 362 to the second layer 363 and moving in the direction B perpendicular to the bonding direction A during the bonding of the inorganic light emitting element 30.

A method of manufacturing the display module 320 includes forming the TFT layer 351 and the first and second connection pads 352 and 353 on the substrate, 350, as shown in FIG. 8A. The method of manufacturing the display module 320 further includes forming the anisotropic conductive layer 360 on the TFT layer 351 to cover at least a portion of the first and second connection pads 352 and 353, as shown in FIG. 8B. The anisotropic conductive layer 360 may include the adhesive layer 361 having a two-layer structure (e.g., first layer 362 and second layer 363), as described above.

The method of manufacturing the display module 320 may further include applying heat to the anisotropic conductive layer 360 while pressing the plurality of inorganic light emitting elements 30 toward the anisotropic conductive layer 360, as shown in FIG. 9. In response to the inorganic light emitting element 30 being pressed toward the anisotropic conductive layer 260, the plurality of conductive balls 365 distributed inside the first layer 362 may be restricted from moving from the first layer 362 to the second layer 363 and moving in the direction B perpendicular to the bonding direction A during the bonding of the inorganic light emitting element 30. As a result, a larger number of conductive balls 365 may come into contact with the pair of first and second electrodes 41 and 42 and the first and second connection pads 352 and 353, which may supply a sufficient amount of current to drive the plurality of inorganic light emitting elements 30.

FIGS. 10A, 10B, and 10C are views illustrating exemplary methods of manufacturing a display module, according to various embodiments of the present disclosure. FIG. 11 is a view illustrating a state in which an inorganic light emitting element is bonded to an anisotropic conductive layer, according to an embodiment of the present disclosure.

The display module 420 of FIGS. 10A to 10C and 11 may include or may be similar in many respects to at least one of the display module 20 of FIGS. 3A to 3C, 4, and 5, the display module 220 of FIGS. 6A to 6D and 7, and the display module 320 of FIGS. 8A, 8B, and 9, and may include features not mentioned above.

Referring to FIGS. 10A to 10C and 11, the display module 420 may include a substrate 450, a TFT layer 451 provided on the substrate 450, a plurality of connection pads (e.g., first connection pad 452 and second connection pad 453) provided on the TFT layer 451, an anisotropic conductive layer 460 provided on the TFT layer 451, and a plurality of inorganic light emitting elements 30 bonded to an upper side of the anisotropic conductive layer 460.

The anisotropic conductive layer 460 may be provided on the TFT layer 451 to cover at least a portion of the first and second connection pads 452 and 453. That is, at least a portion of the first and second connection pads 452 and 453 may be buried in (e.g., disposed inside of) the anisotropic conductive layer 460.

The anisotropic conductive layer 460 may include an adhesive layer 461 and a plurality of conductive balls 465 distributed inside the adhesive layer 461.

When the inorganic light emitting element 30 is pressed toward the anisotropic conductive layer 460 while heat is being applied to the anisotropic conductive layer 460, the adhesive layer 461 may be compressed and the plurality of conductive balls 465 may be brought into contact with the pair of first and second electrodes 41 and 42 and the first and second connection pads 452 and 453, and the pair of first and second electrodes 41 and 42 may be electrically connected (e.g., coupled) to the first and second connection pads 452 and 453.

The adhesive layer 461 may have a two-layer structure. That is, the adhesive layer 461 may include a first layer 462 and a second layer 463 provided on the upper side of the first layer 462. In some embodiments, the plurality of conductive balls 465 may be provided to be distributed inside the first layer 462. That is, in some embodiments, the plurality of conductive balls 465 may not be provided inside the second layer 463.

In some embodiments, the first layer 462 may have a higher viscosity than a viscosity of the second layer 463. For example, the first layer 462 may be formed of a material having a higher viscosity than a viscosity of the second layer 463 at a temperature at which the adhesive layer 461 starts to melt (e.g., due to heat applied to the display module 420). That is, the first layer 462 may have a lower fluidity than a fluidity of the second layer 463. Alternatively or additionally, the first layer 462 may have a thickness 462d smaller than a thickness 463d of the second layer 463.

As described above, when the first layer 462 has a higher viscosity than that of the second layer 463, and the thickness 462d of the first layer 462 is smaller than the thickness 463d of the second layer 463, the plurality of conductive balls 465 distributed inside the first layer 462 may be restricted from moving from the first layer 462 to the second layer 463 and from moving in the direction B perpendicular to the bonding direction A during the bonding of the inorganic light emitting element 30.

The display module 420 may further include a conductive ball control layer 470 provided to restrict the escape of the plurality of conductive balls 465 during the bonding process in order to supply a sufficient amount of current to drive the inorganic light emitting element 30.

In some embodiments, the conductive ball control layer 470 may have a thickness D2 greater than a thickness D1 of the first and second connection pads 452 and 453. Alternatively or additionally, the thickness D2 of the conductive ball control layer 470 may be smaller than a thickness D3 of the anisotropic conductive layer 460.

In some embodiments, the conductive ball control layer 470 may be formed of a polymer material. In optional or additional embodiments, the conductive ball control layer 470 may be formed through (e.g., using) a screen printing process and/or an inkjet process. Alternatively or additionally, the conductive ball control layer 470 may be formed of a photoresist resin material. Alternatively or additionally, the conductive ball control layer 470 may be formed through a photo process. However, the present disclosure is not limited in this regard. For example, the conductive ball control layer 470 may be formed of various materials and/or compounds using one or more fabrication processes without deviating from the scope of the present disclosure.

A method of manufacturing the display module 420 may include forming the TFT layer 451 and the first and second connection pads 452 and 453 on the substrate 450, as shown in FIG. 10A. The method of manufacturing the display module 420 may further include forming the conductive ball control layer 470 on the TFT layer 451, as shown in FIG. 10B. The method of manufacturing the display module 420 may further include forming the anisotropic conductive layer 460 on the TFT layer 451 to cover at least a portion of the first and second connection pads 452 and 53 and at least a portion of the conductive ball control layer 470, as shown in FIG. 10C. The anisotropic conductive layer 460 may include the adhesive layer 461 having a two-layer structure (e.g., the first layer 462 and the second layer 463), as described above.

The method of manufacturing the display module 420 may further include applying heat to the anisotropic conductive layer 460 while pressing the inorganic light emitting element 30 toward the anisotropic conductive layer 460, as shown in FIG. 11. In response to the inorganic light emitting element 30 being pressed toward the anisotropic conductive layer 460, the plurality of conductive balls 465 may be blocked by the conductive ball control layer 470 and may be restricted from moving in the direction B perpendicular to the bonding direction A. As a result, a larger number of conductive balls 465 may come into contact with the pair of first and second electrodes 41 and 42 and the first and second connection pads 452 and 453, which may supply a sufficient amount of current to drive the inorganic light emitting element 30.

FIGS. 12A, 12B, 12C, and 12D are views illustrating exemplary methods of manufacturing a display module, according to various embodiments of the present disclosure. FIG. 13 is a view illustrating a state in which an inorganic light emitting element is bonded to an anisotropic conductive layer, according to an embodiment of the present disclosure.

The display module 520 of FIGS. 12A to 12D and 13 may include or may be similar in many respects to at least one of the display module 20 of FIGS. 3A to 3C, 4, and 5, the display module 220 of FIGS. 6A to 6D and 7, the display module 320 of FIGS. 8A, 8B, and 9, and the display module 420 of FIGS. 10A to 10C and 11, and may include features not mentioned above.

Referring to FIGS. 12A to 12D and 13, a display module 520 may include a substrate 550, a TFT layer 551 provided on the substrate 550, a plurality of connection pads (e.g., first connection pad 552 and second connection pad 553) provided on the TFT layer 551, an anisotropic conductive layer 560 provided on the TFT layer 551, and a plurality of inorganic light emitting elements 30 bonded to an upper side of the anisotropic conductive layer 560.

The anisotropic conductive layer 560 may be provided on the TFT layer 551 to cover at least a portion of the first and second connection pads 552 and 553. That is, at least a portion of the first and second connection pads 552 and 553 may be buried in (e.g., disposed inside of) the anisotropic conductive layer 560.

The anisotropic conductive layer 560 may include an adhesive layer 561 and a plurality of conductive balls 565 distributed inside the adhesive layer 561.

When the inorganic light emitting element 30 is pressed toward the anisotropic conductive layer 560 while heat is being applied to the anisotropic conductive layer 560, the adhesive layer 561 may be compressed and the plurality of conductive balls 565 may be brought into contact with the pair of first and second electrodes 41 and 42 and the first and second connection pads 552 and 553, and the pair of first and second electrodes 41 and 42 may be electrically connected (e.g., coupled) to the first and second connection pads 552 and 553.

The adhesive layer 561 may have a two-layer structure. That is, the adhesive layer 561 may include a first layer 562 and a second layer 563 provided on the upper side of the first layer 562. In some embodiments, the plurality of conductive balls 565 may be provided to be distributed inside the first layer 562. That is, in some embodiments, the plurality of conductive balls 565 may not be provided inside the second layer 563.

The first layer 562 may have a higher viscosity than a viscosity of the second layer 563. For example, the first layer 562 may be formed of a material having a higher viscosity than a viscosity of the second layer 563 at a temperature at which the adhesive layer 561 starts to melt (e.g., due to heat applied to the display module 520). That is, the first layer 562 may have a lower fluidity than a fluidity of the second layer 563. Alternatively or additionally, the first layer 562 may have a thickness 562d smaller than a thickness 563d of the second layer 563.

As described above, when the first layer 562 has a higher viscosity than a viscosity of the second layer 563, and the thickness 562d of the first layer 562 is smaller than the thickness 563d of the second layer 563, the plurality of conductive balls 565 distributed inside the first layer 562 may be restricted from moving from the first layer 562 to the second layer 563 and moving in the direction B perpendicular to the bonding direction A during the bonding of the inorganic light emitting element 30.

The display module 520 may further include a conductive ball control layer 570 provided to restrict the escape of the plurality of conductive balls 565 during the bonding process to supply a sufficient amount of current to drive the inorganic light emitting element 30.

In some embodiments, the conductive ball control layer 570 may have a thickness D2 greater than a thickness D1 of the first and second connection pads 552 and 553. Alternatively or additionally, the thickness D2 of the conductive ball control layer 570 may be smaller than a thickness D3 of the anisotropic conductive layer 560.

In some embodiments, the conductive ball control layer 570 may be integrally formed with the substrate 550. That is, the conductive ball control layer 570 may be formed of the same material as a material forming the substrate 550. The conductive ball control layer 570 may be formed by physically and/or chemically etching an upper surface of the substrate 550.

Figure 12A:
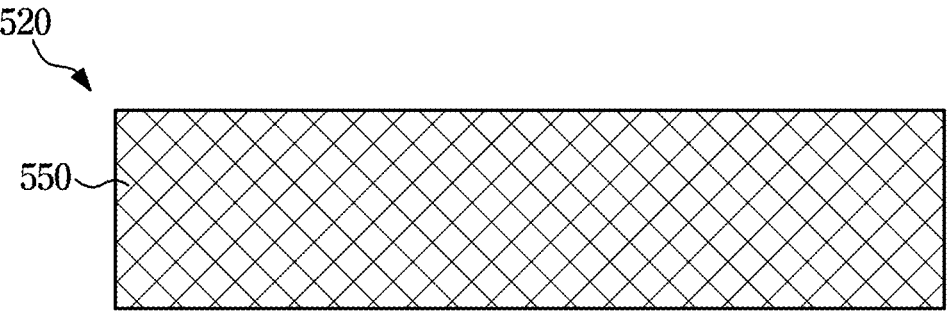
Figure 12B:
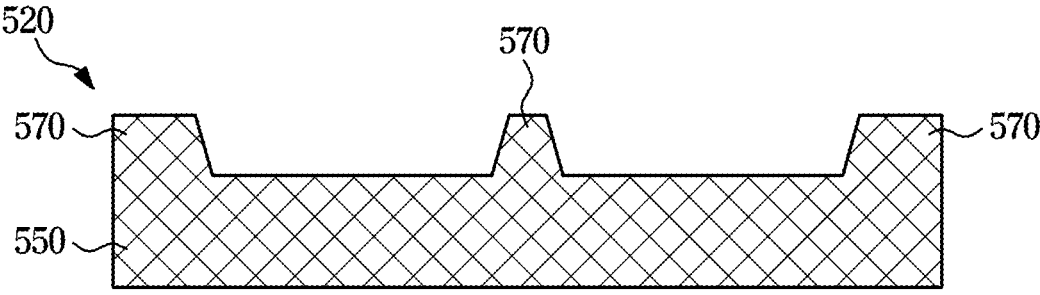
Figure 12C:
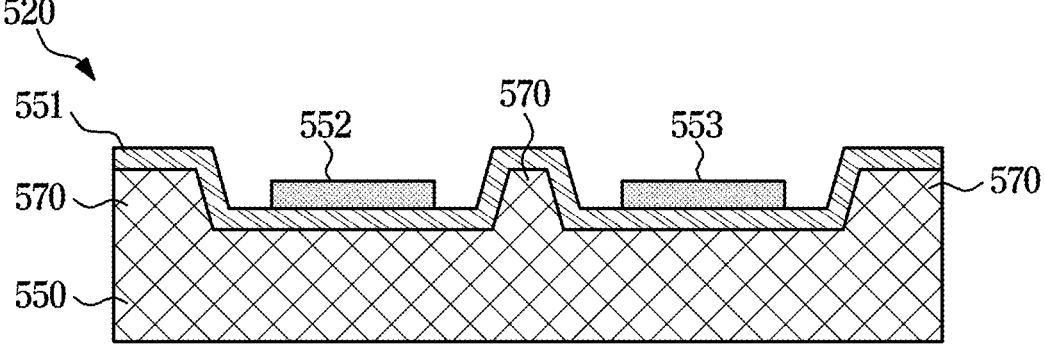
Figure 12D:
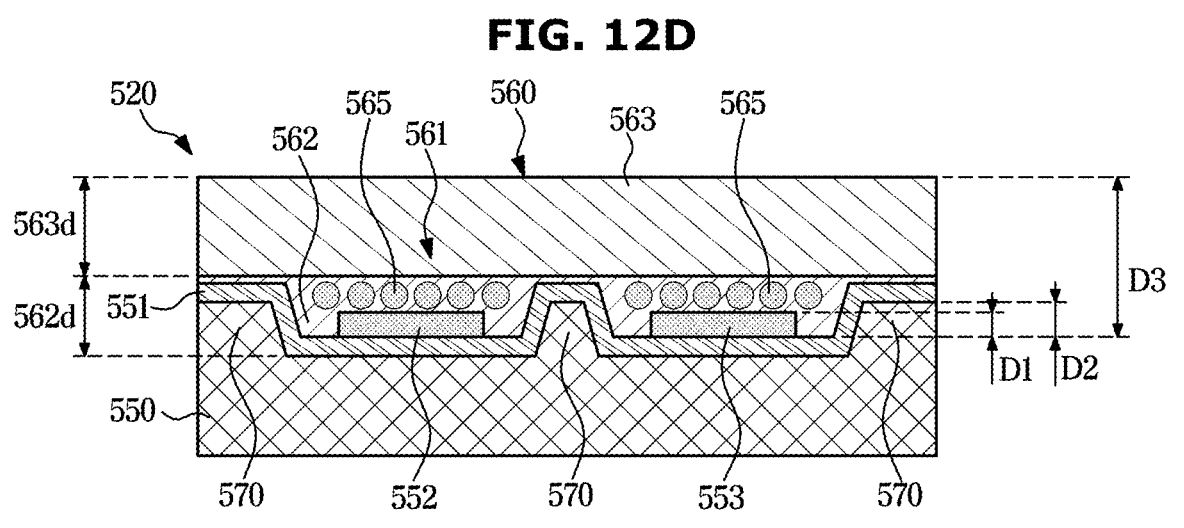

A method of manufacturing the display module 520 may include forming the conductive ball control layer 570 by etching an upper surface of the substrate 550, as shown in FIG. 12B. The method of manufacturing the display module 520 may further include forming the TFT layer 551 and the first and second connection pads 552 and 553 on the substrate 250, as shown in FIG. 12C. The method of manufacturing the display module 520 may further include forming the anisotropic conductive layer 560 on the TFT layer 551 to cover at least a portion of the first and second connection pads 552 and 553 and at least a portion of the conductive ball control layer 570, as shown in FIG. 12D.

The anisotropic conductive layer 560 may include a two-layer structure adhesive layer 561 having a first layer 562 and a second layer 563.

The method of manufacturing the display module 520 may further include applying heat to the anisotropic conductive layer 560 while pressing the inorganic light emitting element 30 toward the anisotropic conductive layer 560, as shown in FIG. 13. In response to the inorganic light emitting element 30 being pressed toward the anisotropic conductive layer 560, the plurality of conductive balls 565 distributed inside the first layer 562 may be restricted from moving from the first layer 562 to the second layer 563 and moving in the direction B perpendicular to the bonding direction A during the bonding of the inorganic light emitting element 30. As a result, a larger number of conductive balls 565 may come into contact with the pair of first and second electrodes 41 and 42 and the first and second connection pads 552 and 553, which may supply a sufficient amount of current to drive the inorganic light emitting element 30.

FIG. 14 is a view illustrating the number of trapped conductive balls between connection pads and electrodes of a display module according to the size of connection pads and electrodes, according to an embodiment of the present disclosure.

Referring to FIG. 14, line (a) (depicted as a thin solid line) may represent a graph showing the number of conductive balls between connection pads (e.g., first and second connection pads) and electrodes (e.g., a pair of first and second electrodes) before a heat/pressure bonding process in relation to the size of the connection pads and the electrodes. Line (b) (depicted as a dotted line) may represent a graph showing the number of conductive balls trapped between connection pads and electrodes after the heat/pressure bonding process has been completed, in a related structure, and in relation to the size of the connection pads and the electrodes. Continuing to refer to FIG. 14, line (c) (depicted as a thick solid line) may represent a graph showing the number of conductive balls trapped between connection pads and electrodes after the heat/pressure bonding process has been completed according to the present disclosure, and in relation to the size of the connection pads and the electrodes.

As shown in FIG. 14, the number of conductive balls located between the connection pads and the electrodes (and/or trapped between connection pads and electrodes) increases in proportion to increasing size of connection pads and electrodes.

In addition, the number of conductive balls trapped between the connection pads and the electrodes after completion of a heat/pressure bonding process (e.g., lines (b) and (c)) is less than the number of conductive balls between the connection pads and the electrodes before the heat/pressure bonding process (e.g., line (a)) for a similar size of the contact pads and the electrodes. The reduction in the number of conductive balls trapped between the connection pads and the electrodes after completion of the heat/pressure bonding process may be caused by the conductive balls moving in a direction perpendicular to a bonding direction by the pressure applied to the inorganic light emitting element and, thus, escaping outside of the space between the connection pads and the electrodes.

As further shown in FIG. 14, the remaining number of trapped conductive balls after completion of the heat/pressure process, according to the present disclosure (e.g., line (c)) is larger than the comparable number (e.g., with a similar size of the contact pads and the electrodes) of trapped conductive balls in the related structure (e.g., line (b)). That is, the conductive ball control layer and/or the two-layer structure of the adhesive layer, according to the present disclosure, allows less conductive balls to escape during the bonding of the inorganic light emitting element, when compared to a related structure.

Consequently, according to an embodiment of the present disclosure, a plurality of conductive balls trapped between the electrodes of an inorganic light emitting element and the connection pads of a substrate when an inorganic light emitting element is mounted on the substrate through an anisotropic conductive layer, may supply a sufficient amount of current to the inorganic light emitting element. Hence, the reliability of the display apparatus may be improved.

Although a few embodiments of the present disclosure have been shown and described, the above embodiments are for illustrative purpose only, and it would be appreciated by those skilled in the art that changes and modifications may be made in these embodiments without departing from the principles and scope of the disclosure, the scope of which is defined in the claims and their equivalents.

What is claimed is:

1. A display module, comprising:
   a substrate;
   a thin film transistor (TFT) layer provided on the substrate;
   a plurality of connection pads provided on the TFT layer;
   an anisotropic conductive layer provided on the TFT layer, the anisotropic conductive layer comprising an adhesive layer and a plurality of conductive balls distributed inside the adhesive layer;
   an inorganic light emitting element bonded to the anisotropic conductive layer, the inorganic light emitting element comprising a plurality of electrodes corresponding to the plurality of connection pads; and
   a conductive ball control layer provided in a surrounding area of the plurality of connection pads on the TFT layer, the conductive ball control layer being configured to restrict the plurality of conductive balls from moving in a direction perpendicular to a bonding direction while the inorganic light emitting element is being bonded to the anisotropic conductive layer,
   wherein the conductive ball control layer is spaced apart from the plurality of connection pads.

2. The display module of claim 1, wherein:
   the anisotropic conductive layer is provided on at least a first portion of the plurality of connection pads and at least a second portion of the conductive ball control layer, and
   at least a third portion of the plurality of connection pads and at least a fourth portion of the conductive ball control layer are disposed inside the anisotropic conductive layer.

3. The display module of claim 1, wherein:
   a first thickness of the conductive ball control layer is greater than a second thickness of the plurality of connection pads, and
   the first thickness of the conductive ball control layer is smaller than a third thickness of the anisotropic conductive layer.

4. The display module of claim 1, wherein the conductive ball control layer is provided to surround at least one connection pad of the plurality of connection pads.

5. The display module of claim 1, wherein the conductive ball control layer has been formed of at least one of a polymer material and a photoresist resin material.

6. The display module of claim 1, wherein the conductive ball control layer has been formed on the TFT layer using at least one of a screen printing process, an inkjet process, and a photo process.

7. The display module of claim 1, wherein the conductive ball control layer has been integrally formed with the substrate.

8. The display module of claim 1, wherein the conductive ball control layer has been formed by etching an upper surface of the substrate.

9. The display module of claim 1, wherein:
the adhesive layer comprises a first layer and a second layer provided on an upper surface of the first layer, and
the plurality of conductive balls are distributed inside the first layer.

10. The display module of claim 9, wherein a first viscosity of the first layer is greater than a second viscosity of the second layer.

11. The display module of claim 9, wherein a first thickness of the first layer is smaller than a second thickness of the second layer.

12. A display module, comprising:
a substrate;
a thin film transistor (TFT) layer provided on the substrate;
a plurality of connection pads provided on the TFT layer;
an anisotropic conductive layer provided on the TFT layer, the anisotropic conductive layer comprising an adhesive layer and a plurality of conductive balls;
an inorganic light emitting element bonded to the anisotropic conductive layer, the inorganic light emitting element comprising a plurality of electrodes corresponding to the plurality of connection pads; and
a conductive ball control layer provided in a surrounding area of the plurality of connection pads on the TFT layer, the conductive ball control layer being configured to restrict the plurality of conductive balls from moving in a direction perpendicular to a bonding direction while the inorganic light emitting element is being bonded to the anisotropic conductive layer,
wherein the conductive ball control layer is spaced apart from the plurality of connection pads,
wherein the adhesive layer comprises a first layer and a second layer provided on an upper side of the first layer, and
wherein the plurality of conductive balls are distributed inside the first layer.

13. The display module of claim 12, wherein a first viscosity of the first layer is greater than a second viscosity of the second layer.

14. The display module of claim 12, wherein a first thickness of the first layer is smaller than a second thickness of the second layer.

15. A display apparatus, comprising:
a frame; and a plurality of display modules installed in an M×N matrix form on the frame,
wherein each display module of the plurality of display modules comprises:
a substrate;
a thin film transistor (TFT) layer provided on the substrate;
a plurality of connection pads provided on the TFT layer;
an anisotropic conductive layer provided on the TFT layer, the anisotropic conductive layer comprising an adhesive layer and a plurality of conductive balls distributed inside the adhesive layer;
an inorganic light emitting element bonded to the anisotropic conductive layer, the inorganic light emitting element comprising a plurality of electrodes corresponding to the plurality of connection pads; and
a conductive ball control layer provided in a surrounding area of the plurality of connection pads on the TFT layer, the conductive ball control layer being configured to restrict the plurality of conductive balls from moving in a direction perpendicular to a bonding direction while the inorganic light emitting element is being bonded to the anisotropic conductive layer,
wherein the conductive ball control layer is spaced apart from the plurality of connection pads.

16. The display apparatus of claim 15, wherein:
the conductive ball control layer has been formed of at least one of a polymer material and a photoresist resin material, and
the conductive ball control layer has been formed on the TFT layer using at least one of a screen printing process, an inkjet process, and a photo process.

17. The display apparatus of claim 15, wherein:
the conductive ball control layer has been integrally formed with the substrate, and
the conductive ball control layer has been formed by etching an upper surface of the substrate.

18. The display apparatus of claim 15, wherein:
the adhesive layer comprises a first layer and a second layer provided on an upper side of the first layer, and
the plurality of conductive balls are distributed inside the first layer.

19. The display apparatus of claim 18, wherein:
a first viscosity of the first layer is greater than a second viscosity of the second layer, and
a first thickness of the first layer is smaller than a second thickness of the second layer.

* * * * *